United States Patent
Zheng et al.

(10) Patent No.: US 9,960,034 B2
(45) Date of Patent: May 1, 2018

(54) METHOD OF FORMING A THIN FILM THAT ELIMINATES AIR BUBBLES

(71) Applicant: Texas Instruments Incorporated, Dallas, TX (US)

(72) Inventors: Sandra Zheng, Allen, TX (US); Mark James Smiley, Plano, TX (US); Douglas Jay Levack, Royce City, TX (US); Ronald Dean Powell, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/369,000

(22) Filed: Dec. 5, 2016

(65) Prior Publication Data

US 2017/0084453 A1    Mar. 23, 2017

Related U.S. Application Data

(62) Division of application No. 14/481,813, filed on Sep. 9, 2014, now Pat. No. 9,548,199.

(51) Int. Cl.
| | |
|---|---|
| *H01L 21/469* | (2006.01) |
| *H01L 21/02* | (2006.01) |
| *C23C 18/00* | (2006.01) |
| *H01L 21/027* | (2006.01) |

(52) U.S. Cl.
CPC ........ *H01L 21/02282* (2013.01); *C23C 18/00* (2013.01); *H01L 21/0273* (2013.01); *H01L 21/02118* (2013.01)

(58) Field of Classification Search
None
See application file for complete search history.

(56) References Cited

U.S. PATENT DOCUMENTS

| | | | |
|---|---|---|---|
| 5,094,884 A * | 3/1992 | Hillman | G03F 7/162 118/320 |
| 5,395,803 A | 3/1995 | Adams | |
| 5,532,192 A | 7/1996 | Adams | |
| 6,165,552 A * | 12/2000 | Anai | B01D 19/0005 118/52 |
| 6,191,053 B1 | 2/2001 | Chun et al. | |
| 6,225,240 B1 * | 5/2001 | You | B05D 1/005 257/E21.243 |
| 6,317,642 B1 * | 11/2001 | You | B05D 1/005 427/240 |
| 6,387,825 B2 * | 5/2002 | You | B05D 1/005 257/E21.259 |
| 6,407,009 B1 * | 6/2002 | You | H01L 21/02134 257/E21.262 |
| 6,436,851 B1 * | 8/2002 | Young | H01L 21/312 257/E21.259 |
| 6,530,340 B2 * | 3/2003 | You | H01L 21/76801 118/320 |

(Continued)

*Primary Examiner* — David E Graybill
(74) *Attorney, Agent, or Firm* — Jacqueline J. Garner; Charles A. Brill; Frank D. Cimino

(57) ABSTRACT

A method, which forms an air-bubble-free thin film with a high-viscosity fluid resin, initially dispenses the fluid resin on an outer region of a semiconductor wafer while the semiconductor wafer is spinning, and then dispenses the fluid resin onto the center of the semiconductor wafer after the semiconductor wafer has stopped spinning.

15 Claims, 3 Drawing Sheets

(56) References Cited

U.S. PATENT DOCUMENTS

| | | | |
|---|---|---|---|
| 6,613,700 B2* | 9/2003 | Hall | H01L 21/312 257/E21.259 |
| 6,638,358 B1 | 10/2003 | You et al. | |
| 7,018,943 B2* | 3/2006 | Emir | B05C 5/0208 438/780 |
| 7,030,039 B2* | 4/2006 | Gurer | B05C 5/0208 118/320 |
| 7,670,643 B2* | 3/2010 | Winter | H01L 21/6715 156/313 |
| 8,389,455 B2* | 3/2013 | Quillen | C11D 7/34 510/175 |
| 8,444,768 B2* | 5/2013 | Quillen | C11D 7/34 134/1.3 |
| 2001/0001407 A1* | 5/2001 | You | H01L 21/6715 156/166 |
| 2001/0001746 A1* | 5/2001 | Chun | B05C 11/08 438/780 |
| 2001/0029111 A1* | 10/2001 | You | B05D 1/005 438/782 |
| 2002/0076945 A1* | 6/2002 | Hall | H01L 21/312 438/782 |
| 2002/0127334 A1* | 9/2002 | Gurer | B05C 5/0208 427/240 |
| 2002/0127878 A1* | 9/2002 | Young | H01L 21/312 438/782 |
| 2006/0013953 A1* | 1/2006 | Winter | H01L 21/6715 427/240 |
| 2006/0165887 A1* | 7/2006 | Lee | G03F 7/162 427/240 |
| 2009/0317546 A1 | 12/2009 | Winter et al. | |
| 2010/0242998 A1* | 9/2010 | Quillen | C11D 7/34 134/19 |
| 2012/0108486 A1* | 5/2012 | Quillen | C11D 7/34 510/176 |
| 2013/0123411 A1* | 5/2013 | Quillen | C11D 7/34 524/377 |

* cited by examiner

METHOD OF FORMING A THIN FILM THAT ELIMINATES AIR BUBBLES

CROSS REFERENCE TO RELATED APPLICATIONS

This application is a divisional of U.S. Nonprovisional patent application Ser. No. 14/481,813, filed Sep. 9, 2014, the contents of which are herein incorporated by reference in its entirety.

BACKGROUND OF THE INVENTION

Field of the Invention

The present invention relates to a method of forming a thin film and, more particularly, to a method of forming a thin film that eliminates air bubbles.

Description of the Related Art

Spin coating is a well-known method of forming a thin film on a semiconductor wafer. In one common approach to spin coating, a puddle of fluid resin is formed at the center of a semiconductor wafer, which is then spun at a high speed, e.g., 1500-4000 rpm. The centrifugal force causes the fluid resin at the center to spread out over the top surface of the wafer. The final thickness and uniformity of the film are typically defined by the rotational speed of the wafer and the length of time the wafer is rotated.

The fluid resin can be dispensed statically or dynamically. With a static dispense, the fluid resin is deposited onto the wafer while the wafer is stationary. With a dynamic dispense, the fluid resin is deposited onto the wafer while the wafer is spinning at a relatively moderate speed, e.g., 500 rpm.

One problem with conventional spin coating is that when a high-viscosity fluid resin is direct line dispensed, air bubbles can be present when the fluid resin is initially dispensed onto the wafer. For example, it is difficult to dispense a fluid resin with a viscosity greater than 400 cP through a nozzle, which is an output structure with an opening that restricts the flow of resin out of a supply line. As a result, the nozzle is often removed from the supply line so that the high-viscosity fluid resin can be dispensed directly from the supply line. Dispensing a fluid resin directly from a supply line is known as a direct line dispense.

One drawback of a direct line dispense is that, in-between uses, air can enter the supply line which, in turn, causes air bubbles to be present the next time the fluid resin is initially dispensed onto a wafer. When the wafer is then spun at a high speed, the air bubbles in the puddle of resin that lie away from the center of the wafer move towards and beyond the outer edge of the wafer in response to the centrifugal force of the high-speed spin.

However, the closer an air bubble lies to the center of the wafer, the less centrifugal force is present and the less likely it is that the air bubble will move beyond the outer edge of the wafer, thereby leaving an air bubble in the resin that remains on the wafer. Thus, there is a need for a method of forming a thin film with a high viscosity fluid resin that eliminates air bubbles which can be present when the fluid resin is initially dispensed.

SUMMARY OF THE INVENTION

The present invention provides a method of forming a thin film that eliminates air bubbles. The method forms the thin film in a processing station that has a wafer chuck and a supply line, where the supply line has a tube dispensing opening. The method includes dispensing a fluid resin from the tube dispensing opening onto a semiconductor wafer while the semiconductor wafer is spinning, and changing a relative position between the wafer chuck and the tube dispensing opening so that the fluid resin is dispensed onto the semiconductor wafer in a circular pattern. The method also includes decelerating the semiconductor wafer from spinning to a stop after the circular pattern has been formed, and changing a relative position between the wafer chuck and the tube dispensing opening so that the fluid resin continues from the circular pattern to a center of the semiconductor wafer, and forms a puddle of resin over the center of the semiconductor wafer.

The present invention further provides an alternate method of forming a thin film. The method includes dispensing a fluid resin from the tube dispensing opening onto a semiconductor wafer while the semiconductor wafer is spinning. The center of the semiconductor wafer is free of the fluid resin while the semiconductor wafer is spinning and the fluid resin is dispensed. The method also includes dispensing the fluid resin from the tube dispensing opening onto the center of the semiconductor wafer while the semiconductor wafer is stationary to form a puddle of resin at the center of the semiconductor wafer.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 3A illustrates a spiral circular pattern, while FIG. 3B illustrates a circular pattern formed from interconnected partially concentric circles.

FIG. 4A illustrates the fluid resin before the wait, while FIG. 4B illustrates the fluid resin after the wait.

DETAILED DESCRIPTION OF THE INVENTION

Figure 1:
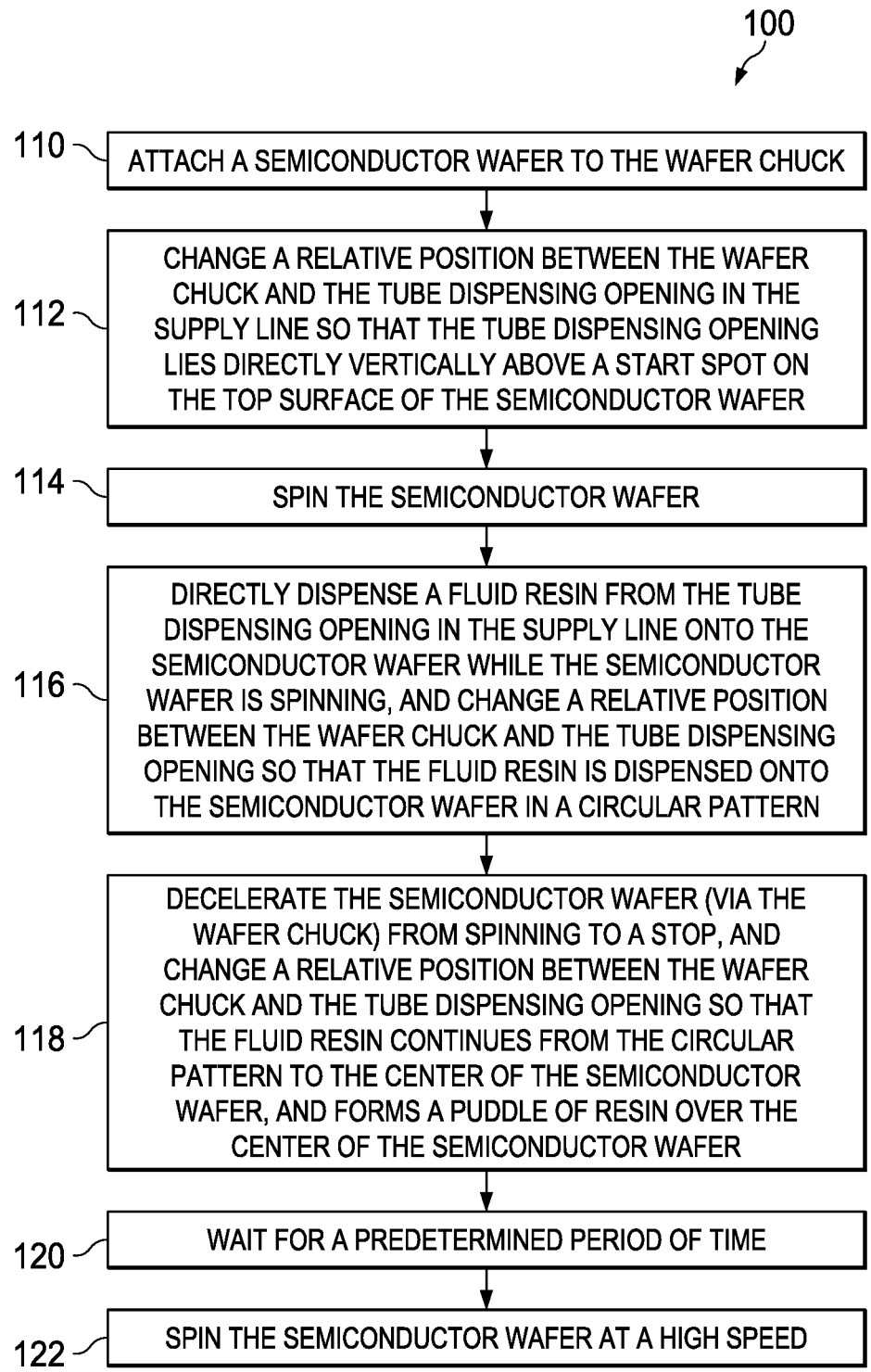
FIG. 1 is a flow chart illustrating an example of a method 100 of forming a thin film in accordance with the present invention.

Air bubbles that remain in the resin that lies over the semiconductor wafer after the high-speed spin lead to a series of events that can severely damage the wafer. For example, when two wafers, such as a CMOS wafer and a MEMS wafer, are bonded together prior to being diced to form a number of stacked chip structures, the bottom wafer is commonly formed to have a number of through-silicon via (TSV) structures that extend completely through the bottom wafer to provide a means of electrically connecting the bottom wafer to a chip carrier.

The formation of the TSV structures often begins by forming a patterned photoresist layer on a wafer. The patterned photoresist layer must be able to withstand an extended etch time, and is typically provided by a thick (e.g., 9 microns), high-viscosity fluid resin that is patterned to have a number of intentional openings.

Air bubbles that are present when the high-viscosity fluid resin is dispensed form relatively large holes in the fluid resin when the air bubbles pop and, therefore, relatively large unintentional openings in the patterned photoresist layer. For example, a patterned photoresist layer may have an intentional opening for a TSV structure that is approximately 25 microns wide, while the width of an unintentional opening that results from a popped air bubble can be approximately 50-300 microns wide.

After the patterned photoresist layer has been formed, the wafer is etched through the patterned photoresist layer to form holes that extend almost completely through the wafer. Following this, metal is then deposited. The metal completely fills the holes in the wafer that result from the intentional openings in the patterned photoresist layer, and form intentional metal structures.

The metal, however, only partially fills the holes in the wafer that result from the unintentional openings (which result from the popped air bubbles) in the patterned photoresist layer, and form unintentional metal structures. The holes are only partially filled because the holes that result from the unintentional popped air bubble openings are so much wider than the intentional openings.

At a later stage, the two wafers are bonded together to form a two-wafer structure. Following this, the backside of the wafer of the two-wafer structure that has the intentional and unintentional metal structures is ground down. The backside grinding exposes the tips of the intentional metal structures, and thereby forms the TSV structures. The backside grinding also exposes the unintentional metal structures, and thereby forms structures which are known as rogue TSV structures.

The backside of the wafer is exposed to the ambient air pressure during the grinding, while the remainder of the two-wafer structure is subjected to a vacuum. This, in turn, creates a pressure differential across the rogue TSV structures. Further, the backside grinding pushes against the rogue TSV structures.

The combined effect of the pressure differential and the force of the grinder against the rogue TSV structures can cause sections of the wafer to crack and pop off, thereby damaging the wafer. A single rogue TSV structure in a wafer typically causes the entire wafer to be scrapped, which significantly impacts the process yield.

FIG. 1 shows a flow chart that illustrates an example of a method 100 of forming a thin film in accordance with the present invention. Method 100 is performed in a processing station that has a wafer chuck and a supply line. The supply line, in turn, has a tube dispensing opening with no nozzle for a direct line dispense. As shown in FIG. 1, method 100 begins at 110 by attaching a semiconductor wafer to the wafer chuck, such as by vacuum mounting.

After the semiconductor wafer has been attached to the wafer chuck, method 100 moves to 112 to change a relative position between the wafer chuck and the tube dispensing opening in the supply line so that the tube dispensing opening lies directly vertically above a start spot on the top surface of the semiconductor wafer.

For example, the supply line can be attached to an arm, which can move radially across the top surface of the semiconductor wafer to position the tube dispensing opening of the supply line directly vertically above the start spot. In this example, the movement of the arm changes the relative position between the wafer chuck and the tube dispensing opening so that the tube dispensing opening lies directly vertically above the start spot. The start spot, in turn, lies away from the center of the semiconductor wafer. In the present example, the start spot lies closer to an outer edge of the semiconductor wafer than to the center of the semiconductor wafer.

Figure 2:
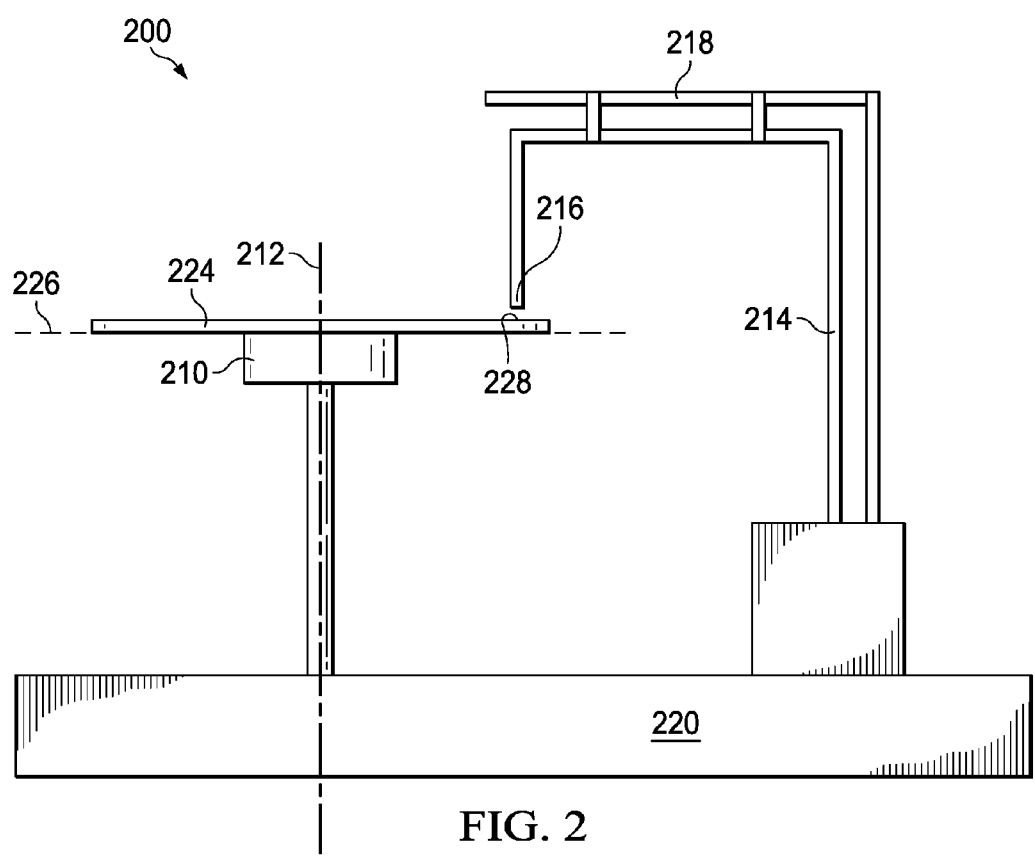
FIG. 2 is a side view illustrating an example of a processing station 200 in accordance with the present invention.

FIG. 2 shows a side view that illustrates an example of a processing station 200 in accordance with the present invention. As shown in FIG. 2, processing station 200 includes a wafer chuck 210 that can rotate about a center axis 212 at a number of speeds, a supply line 214 that can direct line dispense a fluid resin through a tube dispensing opening 216, and an arm 218 that is connected to supply line 214.

In addition, processing station 200 includes a body 220 that is connected to wafer chuck 210 and arm 218. Body 220 can rotate wafer chuck 210, and also change the relative position between wafer chuck 210 and tube dispensing opening 216 in a direction that is substantially perpendicular to center axis 212. For example, when wafer chuck 210 is stopped or rotating about center axis 212, body 220 can move arm 218, and thereby supply line 214 and tube dispensing opening 216, towards and away from the center axis 212 of wafer chuck 210 in a direction that is substantially perpendicular to center axis 212.

Alternately, when wafer chuck 210 is stopped or rotating about center axis 212, body 220 can move wafer chuck 210 towards and away from tube dispensing opening 216 in a direction that is substantially perpendicular to center axis 212. Further, body 220 can move both wafer chuck 210 and arm 218 to achieve the same result.

As also shown in FIG. 2, a semiconductor wafer 224 is attached to wafer chuck 210, and lies in a plane 226 that is substantially perpendicular to center axis 212. In addition, the tube dispensing opening 216 of supply line 214 lies directly vertically over a start spot 228 on the top surface of semiconductor wafer 224.

Returning to FIG. 1, after the tube dispensing opening has been positioned to lie directly vertically above the start spot, method 100 moves to 114 to spin the semiconductor wafer. As the semiconductor wafer spins, the tube dispensing opening lies directly vertically above a circular start region that includes the start spot. The start region, in turn, lies spaced apart from the center of the semiconductor wafer. In the present example, the start region lies closer to the outer edge of the semiconductor wafer than to the center of the semiconductor wafer. Body 220 can rotate wafer chuck 210 to spin the semiconductor wafer. In the present example, the wafer chuck and the semiconductor wafer are spun at the relatively slow speed of approximately 30 rpm.

After this, method 100 next moves to 116 to directly dispense a fluid resin from the tube dispensing opening in the supply line (no nozzle) onto the semiconductor wafer while the semiconductor wafer is spinning, and change a relative position between the wafer chuck and the tube dispensing opening so that the fluid resin is dispensed onto the semiconductor wafer in a circular pattern.

The circular pattern moves inward towards the center of the semiconductor wafer, but is spaced apart from the center of the wafer. At this point, while the semiconductor wafer is spinning and the fluid resin is dispensed to form the circular pattern, the center of the semiconductor wafer is free of the fluid resin.

The circular pattern can be implemented in a number of ways. For example, the circular pattern can be formed as a spiral. In the present example, method 100 forms a spiral circular pattern by simultaneously dispensing the fluid resin and continually changing the relative position between the wafer chuck and the tube dispensing opening.

Alternately, the circular pattern can be formed as a number of interconnected partially concentric circles. In the present example, method 100 forms a number of interconnected partially concentric circles by first dispensing the fluid resin and then, before a circle has been completely formed, changing the relative position between the wafer chuck and the tube dispensing opening to form a next concentric circle.

In the present example, a spiral with two loops or two interconnected partially concentric circles is used. The spirals and circles improve the thickness uniformity of the fluid resin. The optimum number of loops in the spiral, or the number of interconnected partially concentric circles can be experimentally determined.

After the fluid resin has been deposited in a circular pattern, method 100 then moves to 118 to decelerate the semiconductor wafer (via the wafer chuck) from spinning to a stop, and change a relative position between the wafer chuck and the tube dispensing opening so that the fluid resin continues from the circular pattern to the center of the semiconductor wafer, and forms a puddle of resin over the center of the semiconductor wafer. In the present example, the fluid resin extends continuously from the start region on the top surface of the semiconductor wafer to the center of the semiconductor wafer.

Method 100 decelerates the semiconductor wafer from spinning to a stop in less than one revolution so that the semiconductor wafer is stationary before the fluid resin is dispensed onto the center of the semiconductor wafer to form the puddle of resin. Thus, in 118, method 100 dispenses the fluid resin from the tube dispensing opening onto the center of the semiconductor wafer while the semiconductor wafer is stationary to form the puddle of resin at the center of the semiconductor wafer. In the present example, the deceleration and change in relative position begin substantially simultaneously.

Figure 3A:
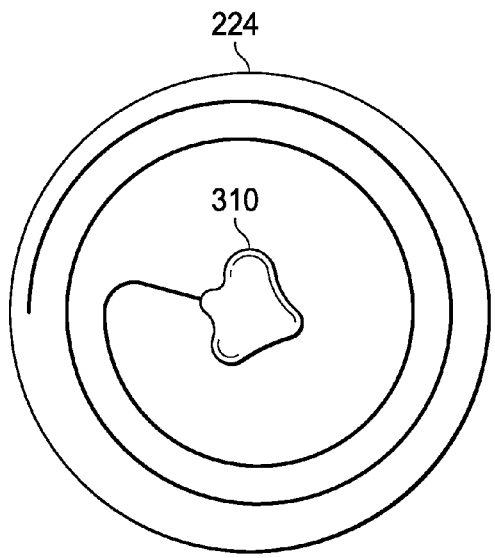
FIGS. 3A-3B are plan views illustrating examples of the deposition of the fluid resin onto the top surface of semiconductor wafer 224 in accordance with the present invention.
Figure 3B:
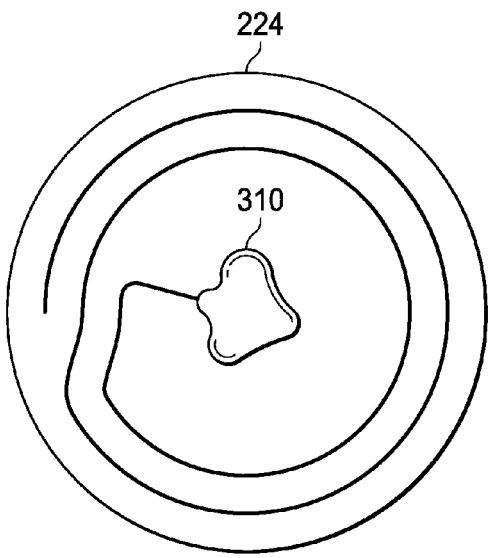

FIGS. 3A-3B show plan views that illustrate examples of the deposition of the fluid resin onto the top surface of semiconductor wafer 224 in accordance with the present invention. FIG. 3A shows a spiral circular pattern, while FIG. 3B shows a circular pattern formed from interconnected partially concentric circles.

As shown in FIG. 3A, after two loops of a spiral circular pattern of fluid resin have been formed, the spinning semiconductor wafer is stopped and fluid resin is deposited as a puddle 310 at the center of semiconductor wafer 224. As shown in FIG. 3B, after two interconnected partially concentric circles of fluid resin have been formed, the spinning semiconductor wafer is stopped and fluid resin is deposited as a puddle 310 at the center of semiconductor wafer 224.

Returning again to FIG. 1, after the fluid resin has been dispensed onto the center of the wafer, method 100 moves to 120 to wait for a predetermined period of time (e.g., 2-3 seconds) to permit the fluid resin to flatten out. Due to surface tension and other factors, the fluid resin has a bulging side surface when initially deposited, that changes to a tapered side after a short wait.

Figure 4A:
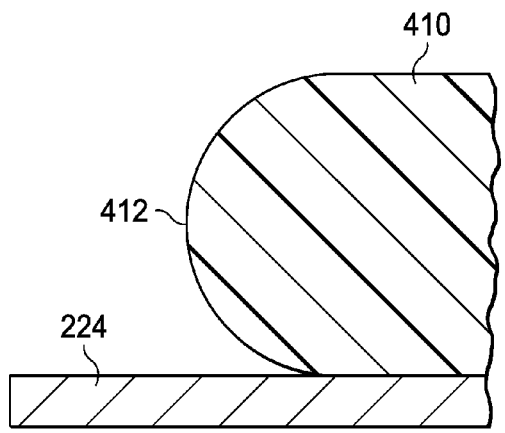
FIGS. 4A-4B are cross-sectional views illustrating examples of the deposition of the fluid resin onto the top surface of semiconductor wafer 224 in accordance with the present invention.
Figure 4B:
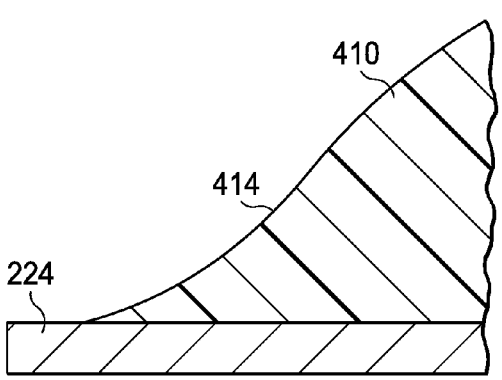

FIGS. 4A-4B show cross-sectional views that illustrate examples of the deposition of the fluid resin onto the top surface of semiconductor wafer 224 in accordance with the present invention. FIG. 4A shows the fluid resin before the wait, while FIG. 4B shows the fluid resin after the wait.

As shown in FIG. 4A, when a fluid resin 410 is initially deposited, the fluid resin 410 has a bulging side surface 412. However, as shown in FIG. 4B, after a short wait, the bulging side surface 412 changes into a tapered side surface 414. The change from a bulging side surface to a tapered side surface is necessary to substantially reduce the likelihood that bubbles can be formed during a subsequent high-speed spin.

If a fluid resin with a bulging side surface such as in FIG. 4A is subjected to a high-speed spin, the bulging portion of the side surface will move outward in response to the centrifugal force at a faster rate than the fluid resin that lies close to the surface of the semiconductor wafer. This faster movement, in turn, can cause the formation of air bubbles. However, by waiting for the bulging side surface to change to a tapered side surface as shown in FIG. 4B, the likelihood of a bubble being formed is substantially reduced.

After waiting for the predetermined period of time, method 100 next moves to 122 to spin the semiconductor wafer at a high speed. The centrifugal force from the rotation causes the fluid resin to flow towards and beyond the outer edge of the semiconductor wafer. The semiconductor wafer can be spun at a high speed by spinning the wafer chuck at a high speed. The wafer chuck can be brought up to a high speed in stages to reduce an acceleration shock to the fluid resin.

In the present example, the wafer chuck is brought up from stopped to 500 rpm in approximately 3 seconds, and is then brought up from 500 rpm to 1500 rpm in approximately 3 seconds. The speed of the wafer chuck is next ramped up from 1500 rpm at approximately 156 rpm/sec until the wafer chuck reaches the casting speed. In the present example, the wafer chuck is spun at the casting speed for 25 seconds.

Air bubbles can be present when a high-viscosity fluid resin is initially direct line dispensed, but naturally stop after a short period of fluid flow. The fluid resin that includes the air bubbles is dispensed in a circular pattern over a region of semiconductor wafer 224 that lies away from the center of semiconductor wafer 224.

The centrifugal force is sufficient to spread the fluid resin formed as a puddle in the center of the semiconductor wafer out over the top surface of the wafer, which then helps to push the fluid resin with the air bubbles out beyond the outer edge of semiconductor wafer 222, thereby removing the air bubbles. In addition, the position of the fluid resin with the air bubbles helps to provide a more uniform resin thickness.

After this, method 100 continues with conventional steps, which include an edge bead removal (EBR) step that removes the edge bead (a thicker region of fluid resin that accumulates at the edge of the semiconductor wafer). Removing the edge bead improves the process yield and also provides a region for the wafer to be handled.

Thus, one of the advantages of the present invention is that the present invention substantially reduces the presence of air bubbles in a thin film of high-viscosity fluid resin that was formed over a semiconductor wafer. The present invention can dramatically increase the process yield, e.g., from less than 30% to over 98%.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a thin film in a processing station, the processing station having a wafer chuck and a supply line, the supply line having a tube dispensing opening, the method comprising:

dispensing a fluid resin from the tube dispensing opening onto a semiconductor wafer while the semiconductor wafer is spinning, a center of the semiconductor wafer being free of the fluid resin while the semiconductor wafer is spinning and the fluid resin is dispensed;
then placing the semiconductor wafer in a stationary state; and
then dispensing the fluid resin from the tube dispensing opening onto the center of the semiconductor wafer while the semiconductor wafer is stationary to form a puddle of resin at the center of the semiconductor wafer.

2. The method of claim 1 and further comprising maintaining the semiconductor wafer in the stationary state for a predetermined period of time after the fluid resin has been dispensed onto the center of the semiconductor wafer.

3. The method of claim 2 and further comprising spinning the semiconductor wafer after the predetermined period of time.

4. The method of claim 3 wherein the fluid resin is continuously dispensed from when the fluid resin is dispensed onto the semiconductor wafer while the semiconductor wafer is spinning, until the puddle of resin has been formed at the center of the semiconductor wafer.

5. The method of claim 3 wherein the fluid resin extends continuously from a start region on a top surface of the semiconductor wafer to the center of the semiconductor wafer, the start region lying closer to an outer edge of the semiconductor wafer than to the center of the semiconductor wafer.

6. The method of claim 1, wherein the tube dispensing opening has no nozzle.

7. The method of claim 1, further comprising maintaining the semiconductor wafer in the stationary state until a side surface of the dispensed fluid resin changes from a bulged side surface to a tapered side surface.

8. The method of claim 7, further comprising spinning the semiconductor wafer to spread the fluid resin over the semiconductor wafer after the side surface changes to the tapered side surface.

9. A method of forming a film in a processing station, the processing station having a wafer chuck and a supply line, the supply line having a tube dispensing opening, the method comprising:
dispensing a fluid resin from the tube dispensing opening onto a semiconductor wafer while the semiconductor wafer is spinning, a center of the semiconductor wafer being free of the fluid resin while the semiconductor wafer is spinning and the fluid resin is dispensed;
then decelerating the semiconductor wafer to a stop;
then dispensing the fluid resin from the tube dispensing opening onto the center of the semiconductor wafer while the semiconductor wafer is stopped to form a puddle of resin at the center of the semiconductor wafer;
keeping the semiconductor wafer stopped until a side surface of the dispensed fluid resin changes from a bulged side surface to a tapered side surface; and
then spinning the semiconductor wafer to spread the fluid resin over the semiconductor wafer.

10. The method of claim 9, wherein the fluid resin is continuously dispensed from when the fluid resin is dispensed onto the semiconductor wafer while the semiconductor wafer is spinning, until the puddle of resin has been formed at the center of the semiconductor wafer.

11. The method of claim 9, wherein the fluid resin extends continuously from a start region on a top surface of the semiconductor wafer to the center of the semiconductor wafer, the start region lying closer to an outer edge of the semiconductor wafer than to the center of the semiconductor wafer.

12. The method of claim 9, wherein the tube dispensing opening has no nozzle.

13. A method of forming a film comprising:
dispensing a fluid resin onto a semiconductor wafer while the semiconductor wafer is spinning, a center of the semiconductor wafer being free of the fluid resin while the semiconductor wafer is spinning and the fluid resin is dispensed;
then decelerating the semiconductor wafer to a stop;
then continuing to dispense the fluid resin from the tube dispensing opening onto the center of the semiconductor wafer while the semiconductor wafer is stopped to form a puddle of resin at the center of the semiconductor wafer;
keeping the semiconductor wafer stopped until a side surface of the dispensed fluid resin changes from a bulged side surface to a tapered side surface; and
then spinning the semiconductor wafer to spread the fluid resin over the semiconductor wafer.

14. The method of claim 13, wherein the fluid resin is continuously dispensed from when the fluid resin is dispensed onto the semiconductor wafer while the semiconductor wafer is spinning, until the puddle of resin has been formed at the center of the semiconductor wafer.

15. The method of claim 13, wherein the fluid resin extends continuously from a start region on a top surface of the semiconductor wafer to the center of the semiconductor wafer, the start region lying closer to an outer edge of the semiconductor wafer than to the center of the semiconductor wafer.

* * * * *